United States Patent [19]

Asano et al.

[11] 4,347,303

[45] Aug. 31, 1982

[54] DRY PLANOGRAPHIC PRINTING PLATE WITH ORGANIC ACID ADDITIVE

[75] Inventors: Masaya Asano; Yoichi Mori; Yoshiaki Takayama, all of Otsu, Japan

[73] Assignee: Toray Industries, Inc., Tokyo, Japan

[21] Appl. No.: 264,617

[22] Filed: May 18, 1981

Related U.S. Application Data

[63] Continuation of Ser. No. 86,326, Oct. 19, 1979, abandoned.

[30] Foreign Application Priority Data

Oct. 20, 1978 [JP] Japan ................................ 53/128577

[51] Int. Cl.$^3$ .................. G03C 1/74; G03C 1/68; G03F 7/10
[52] U.S. Cl. .................................... 430/272; 430/159; 430/162; 430/176; 430/177; 430/273; 430/281; 430/287; 430/303
[58] Field of Search .............. 430/272, 273, 303, 162, 430/166, 175, 176, 177, 917, 281, 287

[56] References Cited

U.S. PATENT DOCUMENTS

| | | | |
|---|---|---|---|
| 3,036,915 | 5/1962 | Notley | 430/917 |
| 3,497,356 | 2/1970 | Martinson | 430/167 |
| 3,677,178 | 7/1972 | Gipe | 430/303 |
| 3,887,450 | 6/1975 | Gilano et al. | 430/917 |
| 3,894,873 | 7/1975 | Kobayashi | 430/303 |
| 4,086,093 | 4/1978 | Ezumi et al. | 430/302 |
| 4,170,481 | 10/1979 | Akama et al. | 430/917 |
| 4,254,209 | 3/1981 | Abe et al. | 430/303 |

*Primary Examiner*—Charles L. Bowers, Jr.
*Attorney, Agent, or Firm*—Austin R. Miller

[57] ABSTRACT

A presensitized dry planographic printing plate comprising a base layer, a photo-sensitive layer and a silicone rubber layer, characterized in that the photo-sensitive layer contains an effective amount of an organic acid.

4 Claims, No Drawings

DRY PLANOGRAPHIC PRINTING PLATE WITH ORGANIC ACID ADDITIVE

This is a continuation of application Ser. No. 86,326, filed Oct. 19, 1979, abandoned.

This invention relates to a dry planographic plate in which non-image areas consist of an ink-repellent silicone rubber layer. In particular, it relates to the improvement of shelf life of dry planographic printing plates.

BACKGROUND OF THE INVENTION

Heretofore, several proposals have been made with reference to dry planographic plates of the type having an ink-repellent silicone rubber layer and a photo-sensitive layer comprising essentially an ethylenically unsaturated monomer and a photoinitiator. When these plates are exposed to light, the photo-sensitive layer polymerizes and/or crosslinks to become insoluble or to adhere firmly to the adjacent silicone rubber layer. In the case of the silicone rubber layer over the photo-sensitive layer, the silicone rubber layer in unexposed areas is washed out together by dissolving the underlying photo-sensitive layer in unexposed areas as described in U.S. Pat. No. 3,677,178. In another case, as described in U.S. Pat. No. 3,894,873, the photo-sensitive layer adheres firmly to the overlying silicone rubber layer upon exposure to light, and the silicone rubber layer is rubbed off only in unexposed areas without dissolving the photo-sensitive layer.

Furthermore, in the case wherein the silicone rubber layer is positioned beneath the photo-sensitive layer as described in U.S. Pat. No. 4,086,093, only unexposed areas of the photo-sensitive layer are dissolved to make non-image areas.

In these dry planographic plates, there exists a boundary layer in which the silicone rubber layer and the photo-sensitive layer are mixed, because the photo-sensitive layer is directly adjacent to the silicone rubber layer or to a thin intermediate layer intervening between two layers. Long time storage duration results in further curing of the silicone rubber in this boundary layer, and then the bonding strength between the silicone rubber layer and the photo-sensitive layer increases and it also becomes difficult to dissolve the photo-sensitive layer. Therefore, in the case wherein the silicone rubber layer is positioned over the photo-sensitive layer, it becomes difficult to wash out the silicone rubber layer in unexposed areas by dissolving the photo-sensitive layer, or to rub it off selectively. In the case wherein the silicone rubber layer is positioned beneath the photo-sensitive layer, unexposed areas of the photo-sensitive layer become difficult to dissolve.

For the above reasons, the dry planographic plates of the prior art have been subjected to the disadvantage of relatively short shelf life. Furthermore, the photo-sensitive layer comprising essentially an ethylenically unsaturated monomer and a photoinitiator tends to polymerize rapidly and is thermally unstable even in the dark. Thus, various inhibitors have usually been added to the photo-sensitive layer. Since these inhibitors are effective in inhibiting thermal polymerization but also tend to restrain photo-polymerization, enough of these inhibitors may not be added.

An object of the present invention is to overcome such deficiencies and to provide a dry planographic plate having the advantages of planographic plates of the prior art and having a longer shelf life as well.

SUMMARY OF THE INVENTION

The presensitized dry planographic printing plate of the present invention comprises a base layer, a photo-sensitive layer which contains an organic acid and a silicone rubber layer. The latter two layers are bonded to one another, with or without an intervening layer.

The organic acids employed in the practice of the present invention are organic carboxylic acids, organic sulfonic acids and organic phosphonic acids, etc. Among them, organic carboxylic acids are the most effective. These carboxylic acids include saturated or unsaturated aliphatic acids, aromatic acids and polycarboxylic acids. Representative examples of these carboxylic acids are the following:

(1) monobasic acids such as acetic, chloroacetic, butyric, caproic, caprylic, cyclohexanecarboxylic, phenylacetic, benzoic and p-chlorobenzoic acids, 2-carboxyfuran, naphthoic, acrylic, methacrylic and cinnamic acids, etc.;

(2) dibasic acids such as oxalic, malonic, succinic, glutaric, adipic, sebacic, maleic, fumaric, and phthalic acids, etc.;

(3) hydroxy acids such as lactic, malic, tartaric and citric acids, etc.;

(4) keto carboxylic acids such as pyruvic, acetoacetic, and leavurinic acids, etc.;

(5) poly-carboxylic acids such as poly-acrylic, poly-methacrylic, poly-cinnamic acids, and their copolymers;

(6) mono-esters of maleic acid, fumaric acid and succinic acid, etc.

Representative examples of organic sulfonic acids are as follows: methane sulfonic acid, ethane sulfonic acid, benzenesulfonic acid, p-toluenesulfonic acid, o-xylene-4-sulfonic acid, naphthalene-2-sulfonic acid, p-chlorobenzenesulfonic acid, phenol-4-sulfonic acid, acetanilide-4-sulfonic acid, anthraquinone-2-sulfonic acid, benzene-1,3-disulfonic acid, etc.

Representative examples of organic phosphonic acids are as follows: ethyl phosphonic acid, diethyl phosphonic acid, benzene phosphonic acid, tetraline phosphonic acid, chloromethyl phosphonic acid, etc.

It is preferable to add at least one kind of such organic acids, to the extent that the total concentration of the organic acid group in the photo-sensitive layer is from 0.01 m mol/g to 1.0 m mol/g. It is especially preferable to make the total concentration of the organic acid group in the photo-sensitive layer from 0.02 m mol/g to 0.5 m mol/g.

The photo-sensitive layer of the present invention is adjacent directly to the silicone rubber layer or to a thin intermediate layer (the aforementioned intervening layer) comprising a silicone primer or silane coupling agent between the two layers. Suitable silicone primers or silane coupling agents include methyltrimethoxysilane, vinyltriethoxysilane, vinyltrichlorosilane, vinyltriacetoxysilane, γ-glycidoxypropyltrimethoxysilane, γ-methacryloxypropyltrimethoxysilane, N-(β-aminoethyl)-γ-aminopropyltrimethoxysilane, N-(β-aminoethyl)-γ-aminopropylmethyldimethoxysilane, γ-sulfhydrylpropyltrimethoxysilane and hexamethyldisilazane, for example.

The thickness of the photo-sensitive layer used in the present invention is not particularly limited, and the following composition is preferably used:

(1) at least one kind of photopolymerizable unsaturated compound having a boiling point above 100° C.;

(2) a photoinitiator;

(3) a heat polymerization inhibitor, as occasion demands;

(4) a polymer or inorganic powder as filler for maintaining the dimensional stability of the photo-sensitive layer, as occasion demands.

Representative examples of the unsaturated compounds are as follows:

(1) (Meth)acrylic acid esters of the following alcohols: methanol, ethanol, propanol, hexanol, octanol, cyclohexanol, ethylene glycol, propylene glycol, diethylene glycol, triethylene glycol, polyethylene glycol, glycerol, trimethylol propane and pentaerythritol, etc.

(2) Adducts of glycidyl (meth)acrylate with the following amines: methylamine, ethylamine, butylamine, benzylamine, ethylenediamine, diethylenetriamine, hexamethylenediamine, xylylenediamine, ethanolamine, dimethylamine, diethylamine, diethanol amine and aniline, etc.

(3) Adducts of glycidyl (meth)acrylate with the following carboxylic acids: acetic acid, propionic acid, benzoic acid, acrylic acid, methacrylic acid, succinic acid, maleic acid, phthalic acid, tartaric acid and citric acid, etc.

(4) (Meth)acrylamide derivatives selected from the group consisting of (meth)acrylamide. N-methylol(-meth)acrylamide, methylene bis-(meth)acrylamide, diacetoneacrylamide, etc.

(5) Styrene derivatives and cinnamic acid derivatives.

When organic acids are used as precursors of ethylenically unsaturated monomers, the monomers often contain unreacted organic acids or acid groups. In these cases, these free organic acids or acid groups can be a portion or the entirety of above-mentioned organic acids.

Representative examples of suitable photoinitiators are as follows:

(1) benzophenone derivatives such as benzophenone, Michler's ketone, xanthone, anthrone, etc.;

(2) benzoin derivatives such as benzoin, benzoin methyl ether, benzoin ethyl ether, etc.;

(3) quinones such as p-benzoquinone, $\beta$-methylanthraquinone, etc.;

(4) azo or diazo compounds such as 2-azo-bis-isobutyronitrile, 1-azo-bis-cyclohexane carbonitrile, p-diazobenzylethyl-aniline, and the like;

(5) sulfur compounds such as dibenzyl disulfide, and di-n-butyl disulfide, for example;

(6) halogen compounds such as carbon tetrabromide, silver bromide, $\alpha$-chloromethyl-naphthalene, and the like.

Representative examples of heat polymerization inhibitors are hydroquinone, phenothiazine, 2,4-dinitrophenol and triphenylmethane, for example.

Representative examples of polymers or inorganic powders as fillers are as follows:

(1) inorganic powders such as colloidal silica, calcium carbonate and titanium dioxide, for example;

(2) vinyl polymers such as polyvinyl acetate, polyvinyl alcohol, polyvinyl butyrol, polyvinyl butyl ether, polyvinyl chloride, polyethylene or copolymers, (meth)acrylic polymers or copolymers, for example;

(3) gums which are not vulcanized yet, such as natural gum, polybutadiene, polyisobutylene, polychloroprene, polyneoprene or copolymers, and the like;

(4) polyamides such as copolymers of the following monomers: caprolactam, laurolactam, hexamethylenediamine, 4,4'-diamino-cyclohexylmethane, 2,4,4'-trimethylhexamethylenediamine, isophoronediamine, diglycolic acid, isophthalic acid and adipic acid, for example;

(5) polyurethane such as polyurethanes of hexamethylenediisocyanate, toluenediisocyanate and isophoronediisocyanate with 1,4-butanediol and polyester-polyol, for example;

(6) polyesters such as condensation products of phthalic anhydride, maleic anhydride, bis-phenol A, ethylene glycol and propylene glycol, for example;

(7) prepolymers of epoxy, urea, alkyd, melamine and phenol resins and the like.

When the polymers contain organic acid groups in the molecules, these acid groups can also be a portion of the above-mentioned organic acids or their entirety.

Photo-fading dyes such as crystal violet can be added in order to distinguish between unexposed areas and exposed areas. Such dyes often work as quenchers to decrease photosensitivity, but on the other hand they are very advantageous since they give better resolution.

The thickness of the silicone rubber layer employed in the practice of the present invention is not particularly limited, but is normally within about 0.5–100$\mu$, and preferably 1–10$\mu$. Silicone rubber suitable for use includes elastomers formed by slightly crosslinking linear diorganopolysiloxanes (preferably dimethylpolysiloxane).

Representative silicone gums include the diorganopolysiloxanes having the central repeating linear unit

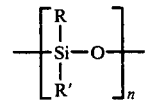

wherein n is an integer not less than 2. R and R' stand for alkyl, aryl or cyanoalkyl groups having 1–20 carbon atoms. Preferably less than 40% of R and R' are vinyl, phenyl, halogenated vinyl, halogenated phenyl groups and more than 60% of R and R' are methyl groups.

While an internal R may become a crosslinking site, depending somewhat on the curing mechanism, for example, in the case of R or R' being H, crosslinking more frequently involves the end groups which may be

  (1)

  (2)

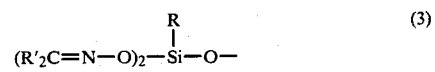  (3)

  (4)

where R and R' have the same meaning as recited above, and R" represents an alkyl group such as methyl or ethyl; Ac represents the acetyl group.

In order to promote curing of silicone rubber through such crosslinking reactions, an organic carboxylic acid salt of a metal is added. Suitable metals include tin, zinc, cobalt, lead, calcium, and manganese, for example, dibutyl tin diacetate, dibutyl tin dilaurate, stannic octoate or cobalt naphthenate, or a catalyst like chloroplatinic acid, for example. In order to improve the tenacity of silicone rubber and to obtain a silicone rubber which has the ability to withstand the frictional forces encountered during printing, it is effective to add a filler into the silicone rubber.

Although it is difficult to understand clearly the reason or reasons why the storage stability of a dry planographic plate is improved by adding organic acids to the photo-sensitive layer, the following mechanisms or effects may be involved:

(1) Thermal polymerization of an ethylenically unsaturated monomer in the dark may be inhibited.

(2) Further curing of silicone rubber upon longer storage may be restrained in the boundary layer where the silicone rubber layer and the photo-sensitive layer are mixed, and the bonding strength between two layers may be stabilized.

(3) Thermal fading of dyes such as crystal violet which affect photo-sensitivity may be restrained.

Moreover, organic acids favorably exhibit much less influence on the photo-polymerization rate than other additives such as heat polymerization inhibitors.

This invention is effectively applied to various kinds of planographic plates which consist of a silicone rubber layer and a photo-sensitive layer located adjacent either directly upon the former or with a thin intermediate layer between the two layers. This invention applies in particular to a photo-sensitive layer comprising essentially an ethylenically unsaturated monomer and a photo-initiator.

In addition, the pot-life of the coating solution which includes an ethylenically unsaturated monomer and a photoinitiator is also favorably prolonged by addition of an organic acid to the solution.

Although specific terms are utilized in the description which follows, these terms are intended to be applied as exemplary of particular forms of this invention, or of particular ways of carrying it into effect, and are not intended to define or to limit the scope of the invention, which is defined in the appended claims.

DETAILED DESCRIPTION OF THE PREFERRED EMBODIMENTS

A positive acting presensitized dry planographic printing plate in accordance with the present invention comprises:

(a) a base layer having sufficient strength to withstand the stresses normally encountered in the printing process;

(b) a photo-sensitive layer superimposed on the base layer containing an organic acid, the total concentration of the acid group in the photo-sensitive layer being in the range of about 0.01 m mol/g to 1.0 m mol/g; and (c) a silicone rubber layer superimposed on the photosensitive layer with or without an intervening layer, comprising one or more silicone primers or silane coupling agents or combinations thereof.

The photo-sensitive layer is preferably a photoadhesive layer. Upon exposure to light through a positive transparency, the photoadhesive layer in the exposed non-image area polymerizes and adheres (or binds) firmly to the silicone rubber overlayer directly or indirectly via an intervening layer, but the photoadhesive layer in the unexposed image area remains non-adhesive (or non-binding) to the silicone overlayer.

Following exposure, the surface of the plate is treated with a developing liquid which is capable of swelling the silicone rubber. Though the silicone rubber layer of this plate is very thick, the silicone rubber layer in the unexposed image area is easily removed, baring a sharp image of oleophilic surface of the photoadhesive layer underlying the removed silicone rubber layer, while the silicone rubber layer in the exposed background area remains bound to the photoadhesive underlayer. The bare surface of the photoadhesive layer accepts ink from the inking rollers of the printing apparatus while the silicone rubber background area does not remove ink from the rollers, and thus remains ink-free.

Since the resulting plate has a thick layer of silicone rubber which is firmly bound to the photopolymerized underlayer in the non-imaged background area, this plate has high scratch resistance and is capable of printing more than one hundred thousand clean copies in the absence of dampening.

The flexible base substrate employed in the practice of the present invention should be sufficiently flexible that it can be mounted on a lithographic press and strong enough that it can withstand the stresses normally produced by the lithographic process. It is useful to apply a coating to prevent halation from the base surface. Representative substrates include coated papers, metals, or plastics such as polyethylene terephthalate, for example. While aluminum appears to be the preferred metal substrate on the basis of costs, handling properties, and the like, sheets of lithographic zinc, or foils of copper, or steel or the like can be employed as flexible substrates in the present invention.

The photoadhesive layer employed in the practice of the present invention polymerizes and firmly binds the overlying silicone rubber layer when exposed to actinic radiation. The photoadhesive layer can be of any desired thickness as long as the layer is coherent, continuous and securely bonded to the base. If necessary, bonding may be effected through an anchor coat layer. Sometimes such an anchor coat may also be effective to prevent halation from the base surface. The thickness of the photoadhesive layer is preferably less than about 4 mils. A layer thinner than 2 mils may be more useful in some cases.

The photoadhesive layer in accordance with this invention comprises the following components: about 1.0–99.9 parts by weight of an ethylenically unsaturated photopolymerizable monomer or oligomer having a boiling point above 100° C., about 0.1–20.0 parts by weight of a photoinitiator, and, if necessary, about 0.0–1.0 part by weight of a heat polymerization inhibitor, about 0.0–95.0 parts by weight of a polymeric material or an inorganic powder, all of which have been exemplified hereinbefore. In the photoadhesive layer, the organic acid group should be present in the range of about 0.01–1.0 m mol/g, preferably about 0.02–0.5 m mol/g. As aforementioned, the organic acid compound is not necessarily newly added when the above components already contain organic acid groups.

A negative acting presensitized dry planographic printing plate in accordance with the present invention comprises:

(a) a base layer having sufficient strength to withstand the stresses normally encountered in the printing process;

(b) a silicone rubber layer superimposed on the base layer; and (c) a photo-sensitive layer superimposed on the silicone rubber layer with or without an intervening layer comprising one or more silicone primers or silane coupling agents, wherein said photo-sensitive layer contains an organic acid and the total concentration of the acid group in the photo-sensitive layer is in the range of about 0.01 m mol/g to 1.0 m mol/g.

The photo-sensitive layer is preferably a photoadhesive layer. Upon exposure to light through a negative transparency, the photoadhesive layer in the exposed image area polymerizes and adheres firmly to the underlying silicone rubber layer directly or indirectly via an intervening layer, whereas the photoadhesive layer in the unexposed non-image area remains non-adhesive to the underlying silicone rubber layer.

Next, a planographic printing plate is produced in which the photoadhesive layer is removed only in the unexposed area to bare the underlying silicone rubber layer, while the photoadhesive layer remaining in the exposed area becomes an ink-receptive image area and the silicone rubber layer in the unexposed area becomes an ink-repellent non-image area.

The components (a), (b) and (c) may be the same as those of the aforementioned positive acting plate.

The following Examples have been selected as illustrative of various ways of carrying the invention into effect. They are not intended to define or to limit the scope of the invention as set forth in the appended claims.

EXAMPLE 1

On a crude aluminum plate, a photo-sensitive layer of the following composition was provided. Its thickness was 4μ.

(a) Polyurethane resin "Pandex T-5201" manufactured by Dainippon Ink & Chemicals, Inc. of Japan—56 parts by weight.

(b) Addition product of 4 mols of glycidyl methacrylate with 1 mol of xylylenediamine—40 parts by weight.

(c) Michler's ketone—4 parts by weight.

(d) Crystal violet—0.4 parts by weight.

Additionally, various organic acids as shown in Table 1 were added to the photo-sensitive layer above mentioned.

The surface of the photo-sensitive layer was overcoated with a 10 wt% n-hexane solution of the following silicone gum composition to provide a silicone rubber layer 3μ thick after drying and curing:

(a) Dimethylpolysiloxane (Mw about 80,000)—100 parts by weight.

(b) Methyltriacetoxysilane—5 parts by weight.

(c) Dibutyltin diacetate—0.2 parts by weight.

Over the silicone rubber layer thus applied, a poly(ethylene terephthalate) film 10μ thick (Toray "Lumirror") was laminated.

Plates thus prepared, and similar plates which were stored for a period of one month at 50° C., were exposed to a high pressure mercury lamp (ORC Jet Light 3000, at a distance of 1 m) through "PS Step Guide" (a gray scale manufactured by Fuji Photofilm Co. Ltd.) for 90 seconds.

Following the exposure, the protective film was peeled off and the surface of the exposed plate was rubbed with a developing pad which was wet with n-heptane.

Each plate after drying was inked with "Driocolourblack" (Dainippon Ink & Chemicals, Inc.) by inking rollers and the step number (the gray scale number) up to which the silicone rubber layer remained as an ink-repellent layer was examined.

The results are summarized in Table 1. In the case of the plates without organic acids, the gray scale number strikingly increased during storage, but the plates with organic acids showed good storage stability.

Moreover, crystal violet in the plates without organic acids faded over 40% after storage, but crystal violet in the plates with organic acids faded much less—less than 10% under the same storage conditions.

TABLE 1

| Additives | wt % of Additives | m mol/g of Acid Group | Gray Scale Number Freshly Made Plate | Gray Scale Number Plate After Storage for One Month at 50° |
|---|---|---|---|---|
| None | — | — | 6 | 12 |
| Succinic acid | 1.0 | 0.17 | 6 | 6 |
| Maleic acid | 1.0 | 0.17 | 6 | 6 |
| Adipic acid | 1.0 | 0.14 | 6 | 7 |
| Itaconic acid | 1.0 | 0.15 | 6 | 7 |
| Copolymer Acrylic acid 43 wt % Butyl acrylate 43 wt % Styrene 14 wt % | 1.0 | 0.053 | 6 | 7 |
| Copolymer Acrylic acid 50 wt % Butyl acrylate 50 wt % | 1.0 | 0.061 | 6 | 7 |
| p-Toluenesulfonic acid | 1.0 | 0.058 | 6 | 7 |

EXAMPLE 2

Example 1 was repeated except that the ethylenically unsaturated monomer of the photo-sensitive layer was replaced by a reaction mixture of 0.5 mols of succinic anhydride with 1 mol of N,N,N',N'-tetrakis-2-hydroxy-3-methacryloyloxypropyl-p-xylylene-diamine.

The concentration of the acid groups in the photosensitive layer was 0.26 m mol/g.

The plate thus produced was exposed to light and developed in the same way as in Example 1, giving a gray scale number of 6. Even after one month storage at 50° C., the plate exhibited the same gray scale number and after one month the thermal fading of crystal violet was less than 10%.

EXAMPLE 3

On an aluminum plate ground by a brush, a silicone primer "SH 4094 Primer" (manufactured by Toray Silicone Co., Ltd. of Japan) was applied in a thickness of 1μ. Onto the resultant film there was applied a silicone gum solution obtained by diluting an RTV silicone gum dispersion "YE 3085" (manufactured by Toshiba Silicone Co., Ltd. of Japan) with n-heptane and adding to this diluted silicone gum dispersion benzoin ethyl ether in an amount of 3% by weight, calculated as solid. The resulting applied silicone gum solution was dried and cured to provide a 5μ thick silicone rubber layer.

On the other hand, a 2μ thick photo-sensitive layer was applied on a 9μ thick polypropylene film "Torayfan" (manufactured by Toray Industries, Inc. of Japan), the photo-sensitive layer having the following composition:

(a) Polyurethane of isophoronediisocyanate with a polyester-polyol comprising adipic acid, hexane-1,6-diol and 2,2-dimethyl-propane-1,3-diol—60 parts by weight.

(b) Addition product of 4 mols of glycidyl methacrylate with 1 mol of xylylenediamine—40 parts by weight.

(c) Michler's ketone—2 parts by weight.

Additionally, various organic acids as listed in Table 2 were added to the photo-sensitive layer above mentioned.

Next, the aluminum base with the silicone rubber layer and the polypropylene film with the photo-sensitive layer were so pressed together that the surface of the silicone rubber layer was in contact with and adhered closely to the surface of the photo-sensitive layer to produce a presensitized planographic plate.

The plates thus prepared, and the similar plates which were stored one month at 50° C., were exposed to light as in Example 1. The protective film was peeled off and the surface of the exposed plate was wetted with n-propanol and rubbed with a developing pad.

The results are summarized in Table 2. In the case of the plate without organic acids, the gray scale number increased greatly as a result of storage, but the plates with organic acids showed good storage stability.

TABLE 2

| Additives | wt % of Additives | Gray Scale Number* Freshly Made Plate | Plate After Storage for One Month at 50° C. |
|---|---|---|---|
| None | — | 9 | 13 |
| Succinic acid | 1.0 | 9 | 9 |
| Maleic acid | 1.0 | 9 | 9 |
| Adipic acid | 1.0 | 9 | 10 |
| Itaconic acid | 1.0 | 9 | 10 |
| Copolymer Acrylic acid 43 wt % Butyl acrylate 43 wt % Styrene 14 wt % | 1.0 | 9 | 9 |
| Copolymer Acrylic acid 50 wt % Butyl acrylate 50 wt % | 1.0 | 9 | 9 |

Note:
*The gray scale number up to which the photo-sensitive layer was insolubilized and remained as an ink-receptive layer after development.

Although this invention has been described with reference to specific embodiments thereof, it will be appreciated that variations may be made, that equivalents may be substituted, and that certain features may be used independently of other features, all as defined in the appended claims.

What is claimed is:

1. A positive acting presensitized dry planographic printing plate comprising:
   (a) a base layer having sufficient strength to withstand the stress normally encountered in the printing process;
   (b) a photo-sensitive layer superimposed on the base layer comprising at least one photopolymerizable unsaturated compound having a boiling point above about 100° C., a photoinitiator and an organic acid, the amount of said organic acid is such that the total concentration of the acid group in the photosensitive layer is in the range of about 0.01 m mol/g to 1.0 m mol/g; and
   (c) a silicone rubber layer superimposed on the photosensitive layer with or without an intervening layer comprising one or more silicone primers or silane coupling agents or combination thereof, wherein said silicone rubber layer comprises crosslinked diorganopolysiloxanes having the central repeating unit of

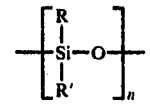

wherein n is not less than 2, R and R' being selected from the groups consisting of alkyl, aryl and cyanoalkyl groups having 1–20 carbon atoms.

2. The presensitized dry planographic printing plate of claim 1 wherein said organic acid is a compound selected from the group consisting of organic carboxylic acids, organic sulfonic acids and organic phosphonic acids.

3. The presensitized dry planographic printing plate of claim 2 wherein said organic carboxylic acid is a compound selected from the group consisting of saturated or unsaturated aliphatic acids, aromatic acids and poly-carboxylic acids.

4. The presensitized dry planographic printing plate of claim 1 wherein said total concentration of said acid group is from 0.02 m mol/g to 0.5 m mol/g.

* * * * *